(12) United States Patent
Kwon et al.

(10) Patent No.: US 10,788,528 B2
(45) Date of Patent: Sep. 29, 2020

(54) CRACK DETECTION CHIP AND CRACK DETECTION METHOD USING THE SAME

(71) Applicant: SAMSUNG ELECTRONICS CO., LTD., Suwon-si, Gyeonngi-Do (KR)

(72) Inventors: Chan-Sik Kwon, Asan-si (KR); Jin Duck Park, Asan-si (KR); Jin Wook Jang, Asan-si (KR); Ji-Yeon Han, Asan-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 16/151,826

(22) Filed: Oct. 4, 2018

(65) Prior Publication Data

US 2019/0265291 A1    Aug. 29, 2019

(30) Foreign Application Priority Data

Feb. 27, 2018  (KR) .................. 10-2018-0023638

(51) Int. Cl.
*G01R 31/11* (2006.01)
*H01L 23/58* (2006.01)
*H01L 23/00* (2006.01)
*H01L 23/528* (2006.01)

(52) U.S. Cl.
CPC .......... *G01R 31/11* (2013.01); *H01L 23/528* (2013.01); *H01L 23/562* (2013.01); *H01L 23/585* (2013.01); *H01L 24/06* (2013.01); *H01L 2224/06131* (2013.01)

(58) Field of Classification Search
CPC ........... H01L 2224/06131; H01L 24/06; H01L 23/585; H01L 23/06; H01L 23/562; H01L 23/528; H01L 23/58; H01R 31/11

USPC .......................................................... 257/48
See application file for complete search history.

(56) References Cited

U.S. PATENT DOCUMENTS

| | | |
|---|---|---|
| 7,649,200 B1 | 1/2010 | Miller et al. |
| 7,863,917 B2 | 1/2011 | Park |
| 7,948,249 B2 | 5/2011 | Park |
| 9,159,646 B2 | 10/2015 | Xie et al. |
| 9,378,317 B2 | 6/2016 | Tschmelitsch et al. |
| 9,454,684 B2 | 9/2016 | Hsiao et al. |
| 9,698,066 B2 | 7/2017 | Lee et al. |
| 9,880,220 B2 | 1/2018 | Hsiao et al. |

(Continued)

FOREIGN PATENT DOCUMENTS

| | | |
|---|---|---|
| JP | 07-117370 | 12/1995 |
| KR | 10-0586847 | 5/2006 |

(Continued)

*Primary Examiner* — Alexander O Williams
(74) *Attorney, Agent, or Firm* — F. Chau & Associates, LLC

(57) ABSTRACT

A crack detection chip includes a chip which includes an internal region and an external region surrounding the internal region, a guard ring formed inside the chip along an edge of the chip to define the internal region and the external region, an edge wiring disposed along an edge of the internal region in the form of a closed curve and a pad which is exposed on a surface of the chip and is connected to the edge wiring. The edge wiring is connected to a Time Domain Reflectometry (TDR) module which applies an incident wave to the edge wiring through the pad, and detects a reflected wave formed in the edge wiring to detect a position of a crack.

10 Claims, 17 Drawing Sheets

(56) References Cited

U.S. PATENT DOCUMENTS

| | | | | |
|---|---|---|---|---|
| 2003/0160261 | A1* | 8/2003 | Moriya | H01L 23/585 |
| | | | | 257/127 |
| 2008/0012572 | A1* | 1/2008 | Tsukuda | H01L 23/585 |
| | | | | 324/522 |
| 2008/0211109 | A1* | 9/2008 | Kumagai | H01L 23/562 |
| | | | | 257/774 |
| 2008/0262370 | A1* | 10/2008 | Varney | A61B 5/0836 |
| | | | | 600/532 |
| 2010/0109005 | A1* | 5/2010 | Grillberger | H01L 22/34 |
| | | | | 257/48 |
| 2013/0083457 | A1* | 4/2013 | Wurzel | G06F 11/3044 |
| | | | | 361/679.01 |
| 2015/0155213 | A1* | 6/2015 | Guo | H01L 24/14 |
| | | | | 257/48 |
| 2017/0062293 | A1* | 3/2017 | Cho | H01L 23/585 |
| 2017/0102929 | A1* | 4/2017 | Lee | G06F 8/61 |
| 2017/0227597 | A1 | 8/2017 | Zettler et al. | |
| 2019/0033365 | A1* | 1/2019 | Sanchez | G01R 31/2896 |
| 2019/0164911 | A1* | 5/2019 | Pan | H01L 23/522 |

FOREIGN PATENT DOCUMENTS

| | | |
|---|---|---|
| KR | 10-2006-0078916 | 7/2006 |
| KR | 10-2007-0017245 | 2/2007 |
| KR | 10-0750192 | 8/2007 |
| KR | 10-0781451 | 12/2007 |
| KR | 10-0946681 | 3/2010 |
| KR | 10-1679205 | 11/2016 |
| KR | 10-1698673 | 1/2017 |

* cited by examiner

CRACK DETECTION CHIP AND CRACK DETECTION METHOD USING THE SAME

CROSS-REFERENCE TO RELATED APPLICATION

This application claims priority under 35 U.S.C. § 119 to Korean Patent Application No. 10-2018-0023638, filed on Feb. 27, 2018 in the Korean Intellectual Property Office, the disclosure of which is incorporated by reference herein in its entirety.

TECHNICAL FIELD

Exemplary embodiments of the inventive concept relate to a crack detection chip and a crack detection method using the same.

DISCUSSION OF RELATED ART

When dicing is performed on individual chips in a wafer during an assembling process of a semiconductor chip and a semiconductor package, minute cracks may occur on edges of the chips. Such cracks progress over time and may cause problems of quality and reliability of the semiconductor chip and the semiconductor package.

A circuit such as a chipping detect circuit (CDC) may be configured to detect cracks, and if a signal does not return within a certain time, it is determined that a defect occurs in an edge region of a chip. In such a method, it is possible to know only the presence or absence of cracks, e.g., the occurrence of defects, and it is not possible to accurately check an occurrence position of cracks.

SUMMARY

According to an exemplary embodiment of the inventive concept, a crack detection chip includes a chip which includes an internal region and an external region surrounding the internal region, a guard ring formed inside the chip along an edge of the chip to define the internal region and the external region, an edge wiring disposed along an edge of the internal region in the form of a closed curve, and a pad which is exposed on a surface of the chip and is connected to the edge wiring. The edge wiring is connected to a Time Domain Reflectometry (TDR) module which applies an incident wave to the edge wiring through the pad, and detects a reflected wave formed in the edge wiring to detect a position of a crack.

According to an exemplary embodiment of the inventive concept, a crack detection chip includes a substrate including first and second regions, a guard ring which separates the first and second regions, an edge wiring formed so as to be buried in the second region, and a pad which is connected to the edge wiring and is exposed to an upper surface of the substrate. The edge wiring is connected to a Time Domain Reflectometry (TDR) module through the pad. The TDR module applies an incident wave to the edge wiring, and detects a reflected wave formed in the edge wiring to detect a position of a crack.

According to an exemplary embodiment of the inventive concept, a crack detection chip includes an edge wiring arranged along an edge of a chip and formed in a closed curve shape, and a pad which is exposed to a surface of the chip and is connected to the edge wiring. The edge wiring is connected to a Time Domain Reflectometry (TDR) module which applies an incident wave to the edge wiring through the pad, and detects a reflected wave formed in the edge wiring to detect a position of a crack.

BRIEF DESCRIPTION OF THE DRAWINGS

The above and other aspects and features of the inventive concept will become more apparent by describing in detail exemplary embodiments thereof with reference to the attached drawings.

DETAILED DESCRIPTION OF THE EMBODIMENTS

Figure 1:
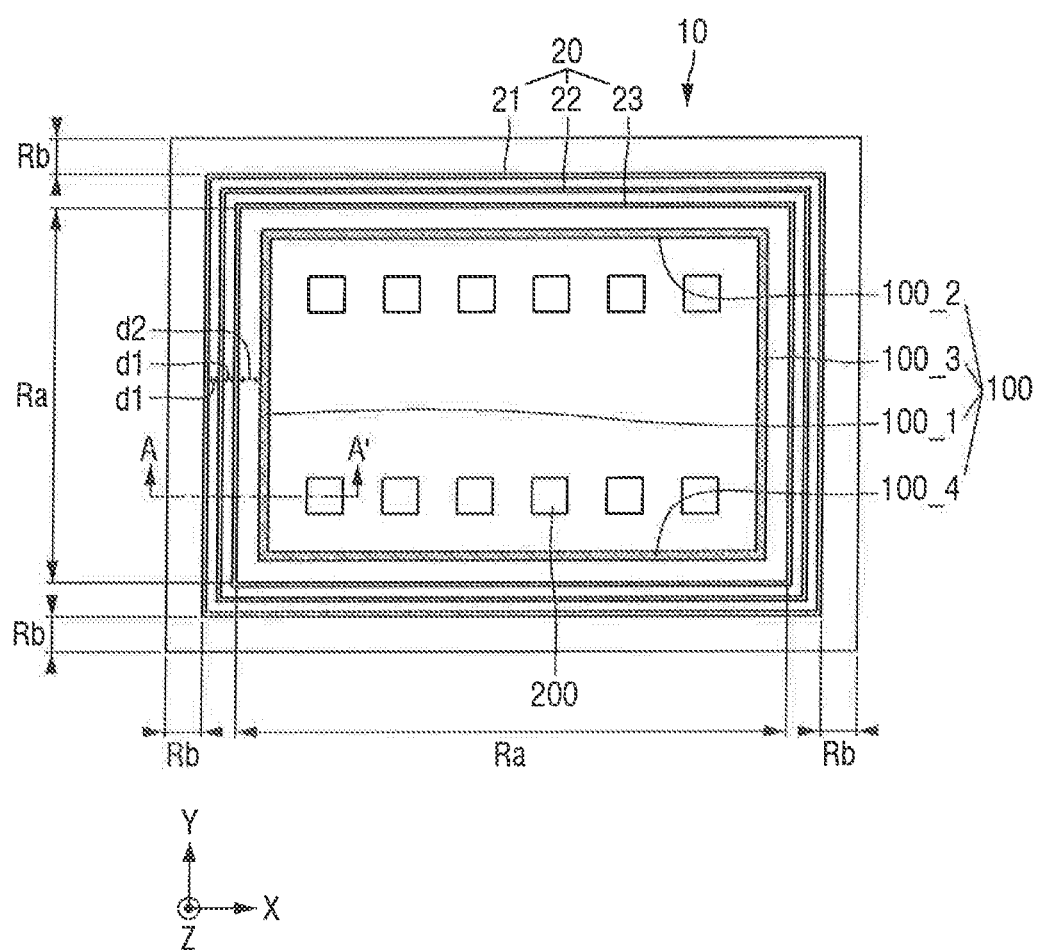
FIG. 1 is a layout diagram for explaining a crack detection chip according to an exemplary embodiment of the inventive concept.

Exemplary embodiments of the inventive concept provide a crack detection chip capable of accurately grasping the crack position of an edge region of a chip.

Exemplary embodiments of the inventive concept also provide a crack detection method capable of accurately grasping the crack position of an edge region of a chip.

Exemplary embodiments of the inventive concept will be described more fully hereinafter with reference to the accompanying drawings. Like reference numerals may refer to like elements throughout this application.

Hereinafter, a crack detection chip according to an exemplary embodiment of the inventive concept will be described with reference to FIGS. 1 to 5.

Figure 2:
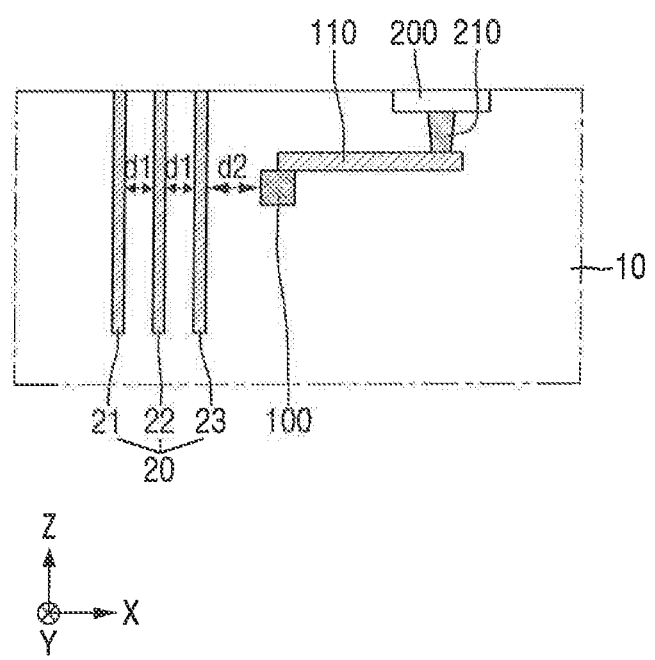
FIG. 2 is a cross-sectional view taken along line A-A' of FIG. 1 according to an exemplary embodiment of the inventive concept.

FIG. 1 is a layout diagram for explaining a crack detection chip according to an exemplary embodiment of the inventive concept, and FIG. 2 is a cross-sectional view taken along line A-A' of FIG. 1 according to an exemplary embodiment of the inventive concept.

Referring to FIGS. 1 and 2, a crack detection chip according to an exemplary embodiment of the inventive concept includes a chip 10, a guard ring 20, a first edge wiring 100, and a pad 200.

The chip 10 may include constituent elements other than the chip 10. The chip 10 may be obtained by dicing a substrate to a certain size. In other words, a plurality of chips 10 may be manufactured by cutting the substrate of a wafer level. For example, the chip 10 may be manufactured by cutting a wafer of a semiconductor material such as silicon.

As illustrated in FIG. 1, a shape of a horizontal plane of the chip 10 may be square. The shape of the chip 10 may be defined by four sides extending in a first direction X or a second direction Y. The first direction X and the second direction Y may be perpendicular to each other. However, the inventive concept is not limited thereto.

An upper surface of the chip 10 may be formed in a third direction Z. The third direction Z may be perpendicular to both the first direction X and the second direction Y. If the first direction X and the second direction Y are a horizontal direction, the third direction Z may be a vertical direction.

The chip 10 may include an internal region Ra and an external region Rb. The external region Rb may be an edge region of the chip 10. In other words, the external region Rb may be a region formed along the outer edge of the chip 10. For example, the external region Rb may refer to a region located outside on the basis of the guard ring 20 among the regions of the chip 10.

The internal region Ra may be a region surrounded by the external region Rb. In other words, the external region Rb is located along the edge of the internal region Ra, and the external region Rb may surround the internal region Ra. The configuration in which the external region Rb surrounds the internal region Ra may be illustrated on a horizontal plane defined by the first direction X and the second direction Y. In other words, as illustrated in FIG. 1, the external region Rb may surround the internal region Ra and may be arranged in an annular form.

The internal region Ra and the external region Rb may be defined by the guard ring 20. For example, the internal region Ra may be a region located inside the guard ring 20, and the external region Rb may be a region located outside the guard ring 20. The region in which the guard ring 20 is formed may not belong either to the internal region Ra or the external region Rb.

The internal region Ra may be a region in which elements actually operating on the chip 10 are formed. In contrast, the external region Rb may be a region in which no element is formed or dummy elements are formed. The external region Rb may be a place having a space margin in case of a damaged part when dicing the wafer to the chip 10. In other words, the external region Rb may be a scribe line.

Even if a crack, e.g., a cracking phenomenon of the chip 10 occurs in the external region Rb, there may be no problem in the direct operation of the chip 10. However, when cracks occur in the internal region Ra of the chip 10 or progress from the external region Rb to the internal region Ra, the reliability of the operation of the chip 10 may be greatly impaired. Therefore, for normal operation of the chip 10, cracks should be prevented from forming in the internal region Ra.

The guard ring 20 may be located between the internal region Ra and the external region Rb. The guard ring 20 may serve to block progress of the above-described cracks from the external region Rb to the internal region Ra.

Further, the guard ring 20 may perform a moisture absorption action which prevents external moisture from entering the inside of the chip 10. In other words, when moisture enters the internal region Ra of the chip 10, the elements located in the internal region Ra of the chip 10 may be damaged or malfunction. The guard ring 20 may prevent such problems.

The guard ring 20 may be formed while making a closed curve along the edge of the chip 10. Here, "closed curve" refer to ring shapes that are in contact with one another, but does not mean that the extended portion of the guard ring 20 necessarily has curvature. For example, the horizontal arrangement shape of the guard ring 20 may be a polygon such as a rectangle, rather than a circle or an ellipse.

For example, the horizontal shape of the guard ring 20 may be a rectangle having four sides extending in the first direction X or the second direction Y. In other words, the guard ring 20 may be formed inside the chip 10 along the edge of the chip 10 and have a rectangular horizontal shape similar to the shape of the chip 10. However, the inventive concept is not limited thereto. In other words, as the shape of the chip 10 changes, the arrangement shape of the guard ring 20 may also change.

Alternatively, the shape of the chip 10 and the arrangement shape of the guard ring 20 may be different from each other. In other words, since the guard ring 20 is intended to protect the internal region Ra of the chip 10, as long as it is possible to protect the internal region Ra of the chip 10, any form or shape of the guard ring 20 may be arranged.

A plurality of guard rings 20 may be provided. When the plurality of guard rings 20 is provided as compared to the case where the guard ring 20 has a single structure, the probability of preventing the progress of cracks naturally increases, and the possibility of blocking moisture permeation into the internal region Ra may also increase.

The guard ring 20 may include a first guard ring 21, a second guard ring 22, and a third guard ring 23. However, the inventive concept is not limited thereto. Three guard rings 20 are merely exemplary, and the number of guard rings 20 may vary depending on the need and purpose.

The first guard ring 21 may be in direct contact with the external region Rb. The outside of the first guard ring 21 may be the external region Rb. The second guard ring 22 may be located inside the first guard ring 21. Likewise, the third guard ring 23 may be located inside the second guard ring 22. In other words, the third guard ring 23 may be in direct contact with the internal region Ra. The inside of the third guard ring 23 may be the internal region Ra.

The first guard ring 21 and the second guard ring 22 may be spaced apart from each other by a first distance d1. Similarly, the second guard ring 22 and the third guard ring 23 may be spaced apart from each other by the first distance d1. However, the inventive concept is not limited thereto.

The guard ring 20 may be formed on the upper surface of the chip 10 to be deep in the third direction Z. Since the guard ring 20 is formed to merely prevent cracks of the external region Rb, external moisture, and the like, the guard ring 20 may be isolated without being connected to other elements. This is substantially the same for each of the plurality of guard rings 20. In other words, the first guard ring 21, the second guard ring 22, and the third guard ring 23 may be disposed to be spaced apart from one another without being in contact with one another.

The guard ring 20 may include a metal material. For example, the guard ring 20 may include, but is not limited to, at least one of tungsten, copper, cobalt, or aluminum.

The first edge wiring 100 may be located in the internal region Ra. In other words, the first edge wiring 100 may be formed along the edge of the internal region Ra. Therefore, the first edge wiring 100 may be located inside the guard ring 20. In particular, in FIGS. 1 and 2, the first edge wiring 100 may be located inside the third guard ring 23.

The first edge wiring 100 may be separated from the guard ring 20 by a second distance d2. The second distance d2 may be larger than the first distance d1. However, the inventive concept is not limited thereto. The first distance d1 between the plurality of guard rings is effectively a small space to prevent progress of cracks. In contrast, the second distance d2 between the first edge wiring 100 and the guard ring 20 may be a certain distance or more so as not to be coupled to each other. As a result, the second distance d2 may be larger than the first distance d1.

Since the first edge wiring 100 is formed along the edge of the internal region Ra, it may be arranged in a shape corresponding to the shape of the internal region Ra. In other words, as illustrated in FIG. 1, the first edge wiring 100 may have a rectangular horizontal shape similar to the shape of the internal region Ra.

The first edge wiring 100 may include a first line 100_1, a second line 100_2, a third line 100_3, and a fourth line 100_4. The first line 100_1 and the second line 100_2 may extend in the second direction Y and may be separated from each other in the first direction X. The third line 100_3 and the fourth line 100_4 may extend in the first direction X and may be separated from each other in the second direction Y. The first line 100_1, the second line 100_2, the third line 100_3 and the fourth line 100_4 may correspond to each side of a rectangle defined by the first edge wiring 100.

The first edge wiring 100 may be a buried wiring. In other words, the first edge wiring 100 may not be exposed to the outside through the upper surface or the lower surface of the chip 10. In other words, the upper surface of the first edge wiring 100 may not be in contact with the upper surface of the chip 10, and the lower surface of the first edge wiring 100 may not be in contact with the lower surface of the chip 10.

The width of the first edge wiring 100 in the third direction Z may be smaller than the width of the guard ring 20 in the third direction Z. In the case of the guard ring 20, it is necessary to isolate the largest or widest region of the external region Rb to prevent cracks and moisture. In contrast, since the first edge wiring 100 is merely for detecting the presence or absence of cracks, the width of the first edge wiring 100 in the third direction Z may be smaller than the width of the guard ring 20 in the third direction Z.

The first edge wiring 100 may be electrically connected to the pad 200. The first edge wiring 100 may be in contact with an internal wiring 110 so as to be electrically connected to the pad 200. The internal wiring 110 may be a wiring that connects the pad 200 and the first edge wiring 100 in the horizontal direction, e.g., the first direction X.

The internal wiring 110 may be connected to the pad 200 through a contact 210. The contact 210 may connect the pad 200 and the internal wiring 110 in the vertical direction, e.g., the third direction Z.

The internal wiring 110, the contact 210, and the first edge wiring 100 may include a conductor. For example, the internal wiring 110, the contact 210, and the first edge wiring 100 may include a metal. The metal may include, for example, at least one of tungsten, copper, cobalt, or aluminum.

The above-described configuration of the internal wiring 110 and the contact 210 is merely exemplary. In other words, as long as the first edge wiring 100 and the pad 200 can be electrically connected to each other, at least one of the internal wiring 110 and the contact 210 may be omitted. Alternatively, the first edge wiring 100 and the pad 200 may also be electrically connected to each other through elements other than the internal wiring 110 and the contact 210.

The pad 200 may be exposed on the upper surface of the chip 10. The pad 200 may perform the role of a path through which other external modules can be connected to the inside of the chip 10. As described above, the pad 200 may be electrically connected to the first edge wiring 100. The pad 200 may transfer clock signals and input and output signals to other constituent elements of the chip 10.

A plurality of pads 200 may be provided. A part of the plurality of pads 200 may be connected to the first edge wiring 100, and the other part thereof may be connected to other components.

Figure 3:
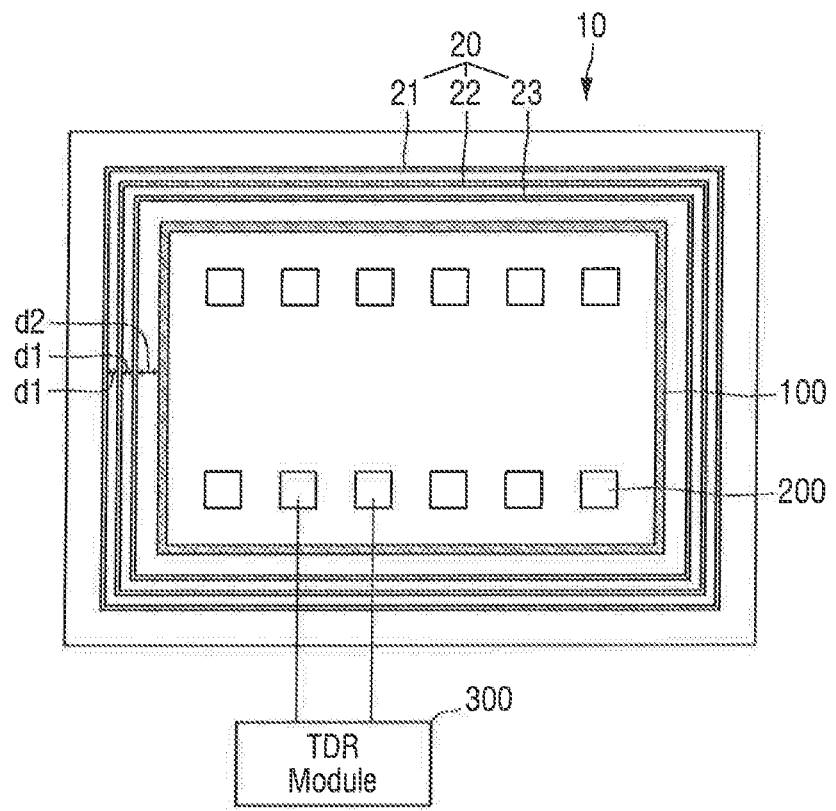
FIG. 3 is a conceptual layout diagram for explaining a connection between the crack detection chip of FIG. 1 and a Time Domain Reflectometry (TDR) module according to an exemplary embodiment of the inventive concept.
Figure 4:
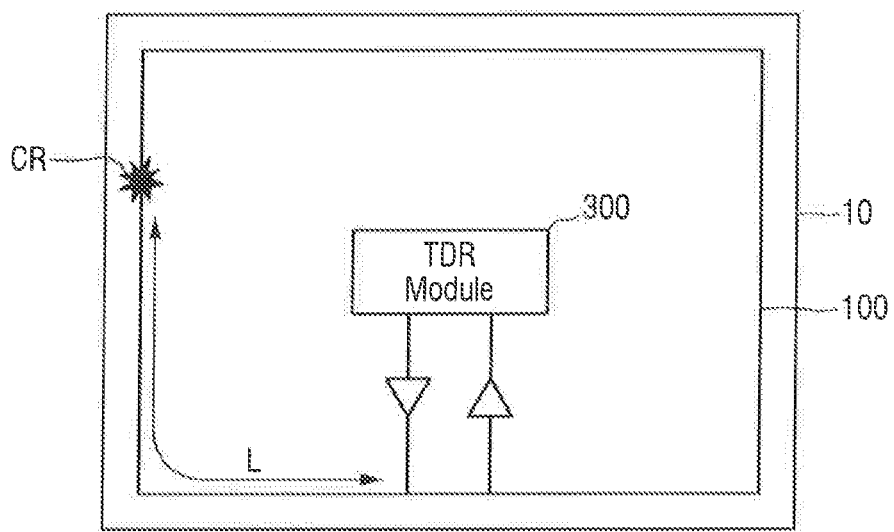
FIG. 4 is a conceptual diagram for explaining the operation of the crack detection chip and the TDR module of FIG. 3 according to an exemplary embodiment of the inventive concept.
Figure 5:
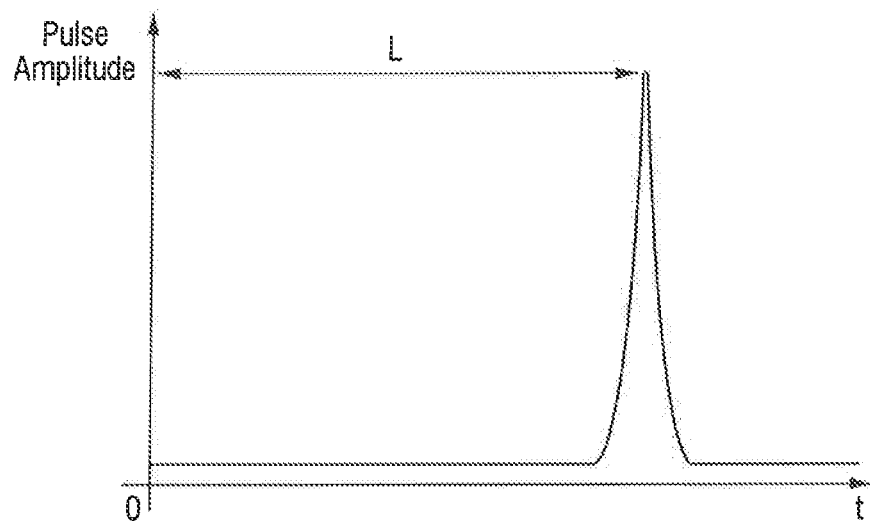
FIG. 5 is a graph for explaining a reflected wave distance according to the detection of a reflected wave over time according to an exemplary embodiment of the inventive concept.

FIG. 3 is a conceptual layout diagram for explaining a connection between the crack detection chip of FIG. 1 and a Time Domain Reflectometry (TDR) module according to an exemplary embodiment of the inventive concept, and FIG. 4 is a conceptual diagram for explaining the operation of the crack detection chip and the TDR module of FIG. 3 according to an exemplary embodiment of the inventive concept. FIG. 5 is a graph for explaining a reflected wave distance according to the detection of a reflected wave over time according to an exemplary embodiment of the inventive concept.

Referring to FIGS. 3 to 5, the first edge wiring 100 may be electrically connected to a TDR module 300 via the pad 200. The TDR module 300 may detect a crack CR of the edge region of the chip 10, using time domain reflectometry.

For example, the TDR module 300 may apply an incident wave to the first edge wiring 100 through the pad 200. When the incident wave encounters the crack CR while traveling through the first edge wiring 100, the incident wave may form a reflected wave.

In other words, when the first edge wiring 100 is disconnected by the crack CR, different media such as the first edge wiring 100 and the crack CR may be in contact with each other. A part of the incident wave is reflected and a part thereof is transmitted at the boundary surface between the two media. As a result, a reflected wave is formed and travels in a direction opposite to a traveling direction of the incident wave.

The TDR module 300 may sense the reflected wave traveling in a direction opposite to the incident wave. The TDR module 300 may calculate a first reflected wave distance L by calculating an application time point of the incident wave and an arrival time point of the reflected wave.

The first reflected wave distance L may refer to a distance from the position at which the crack CR is formed to the TDR module 300 at which the reflected wave arrives. The TDR module 300 detects the first reflected wave distance L and may accurately check the position at which the crack CR occurs accordingly. The first reflected wave distance L may be calculated through the velocity of the incident wave, the velocity of the reflected wave, the arrival time, and the like. A point of t=0 of FIG. 5 may refer to a time point at which the reflected wave is generated.

The crack detection chip according to the present exemplary embodiment may accurately detect at which portion the crack is located, rather than simply determining whether or not a crack exists in the edge region. As a result, it is possible to check which part of the chip 10 should be supplemented, and it is possible to track which process in the manufacturing processes of the chip 10 may be a problem. Further, it is also possible to change the design of the chip 10 later in consideration of the durability of the chip 10.

In other words, the crack detection chip according to the present exemplary embodiment can not only simply check and supplement the durability of the current chip 10 accordingly, but also improve the design and process elements of the chip 10 to be produced in the future.

Hereinafter, the crack detection chip according to an exemplary embodiment of the inventive concept will be described with reference to FIG. 6. Repeat descriptions of similar elements will be omitted or simplified.

Figure 6:
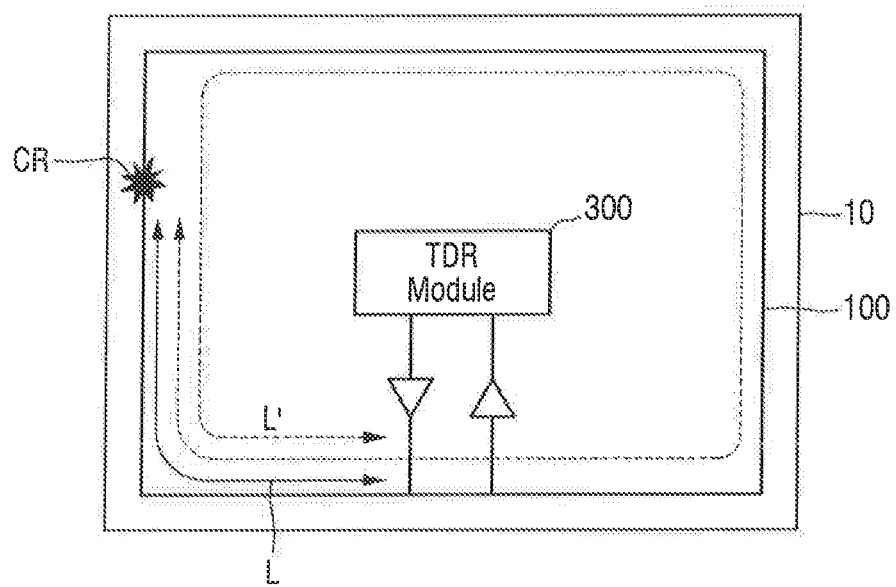
FIG. 6 is a conceptual diagram for explaining the operation of a crack detection chip and a TDR module according to an exemplary embodiment of the inventive concept.

FIG. 6 is a conceptual diagram for explaining the operation of a crack detection chip and a TDR module according to an exemplary embodiment of the inventive concept.

Referring to FIG. 6, the TDR module 300 may not recognize the first reflected wave distance L. In other words, when the limit of the minimum distance that can be recognized by the TDR module 300 is larger than the size of the first reflected wave distance L, the TDR module 300 may not immediately detect the first reflected wave distance L.

In such a case, the TDR module 300 may recognize a second reflected wave distance L' instead of the first reflected wave distance L. The second reflected wave distance L' may be a distance obtained by adding the length of the first edge wiring 100 to the first reflected wave distance L. When the TDR module 300 recognizes the second reflected wave distance L', since the second reflected wave distance L' is larger than the length of the first edge wiring 100, the difference obtained by subtracting the length of the first edge wiring 100 from the second reflected wave distance L' may be recognized as the reflected wave distance L. In the crack detection chip according to the present exemplary embodiment, since the length of the first edge wiring 100 has an already fixed numerical value, the crack CR can be easily detected in spite of limits of the recognition capability of the TDR module 300.

Unlike FIG. 6, when the limit of the minimum distance that can be recognized by the TDR module 300 is larger than the second reflected wave distance L', it is possible to use a reflected wave distance to which an integer multiplication of the length of the first edge wiring 100 is added. Through this, it is possible to accurately detect the position of the crack CR, regardless of the hardware performance of the TDR module 300.

Hereinafter, a crack detection chip according to an exemplary embodiment of the inventive concept will be described referring to FIG. 7. Repeat descriptions will be omitted or simplified.

Figure 7:
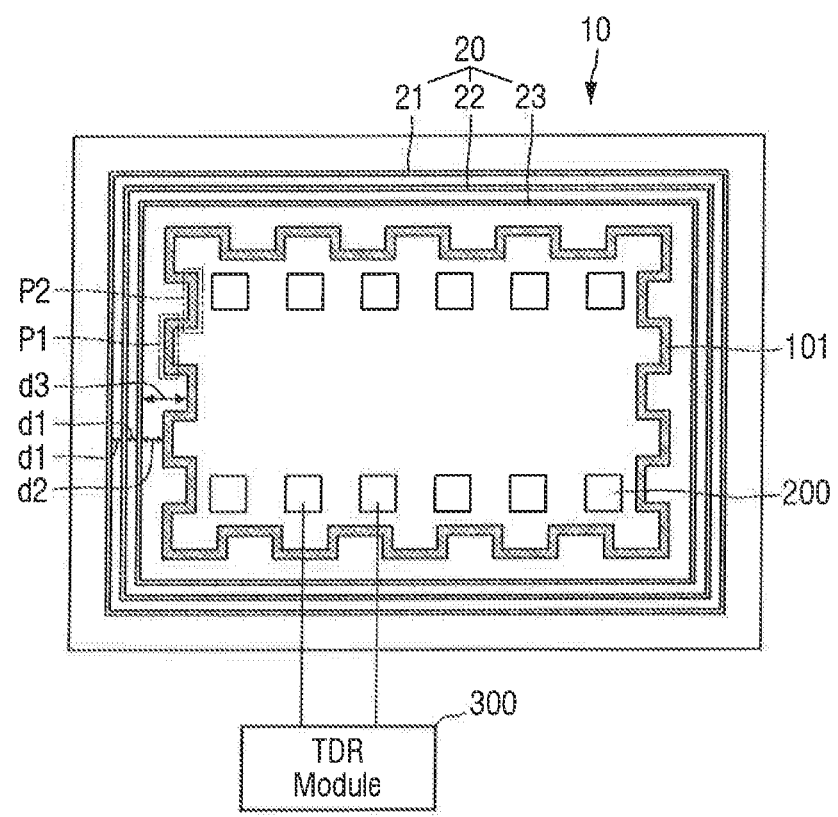
FIG. 7 is a layout diagram for explaining a crack detection chip according to an exemplary embodiment of the inventive concept.

FIG. 7 is a layout diagram for explaining a crack detection chip according to an exemplary embodiment of the inventive concept.

Referring to FIG. 7, the crack detection chip according to an exemplary embodiment of the inventive concept includes a second edge wiring 101.

The second edge wiring 101 may have an uneven shape. The second edge wiring 101 may include a first portion P1 and a second portion P2.

The first portion P1 may be a portion spaced apart from the guard ring 20, e.g., the third guard ring 23, by the second distance d2. In contrast, the second portion P2 may be a portion spaced apart from the third guard ring 23 by a third distance d3. The third distance d3 may be larger than the second distance d2.

The second edge wiring 101 may include a plurality of first portions P1 and a plurality of second portions P2. The second edge wiring 101 may be formed by alternatively extending a plurality of first portions P1 and a plurality of second portions P2. Accordingly, the second edge wiring 101 may have an uneven, zigzag shape.

The crack detection chip according to the present exemplary embodiment may secure a reflected wave path longer than the first edge wiring (e.g., 100 of FIG. 1) of the above-described exemplary embodiment, through the second edge wiring 101 having the uneven shape.

Through this, the TDR module 300 may acquire the reflected wave distance larger than the limit of the minimum distance that can be more easily recognized by the TDR module 300. Therefore, the TDR module 300 can easily recognize the reflected wave distance, without adding an arithmetic process of adding an integer multiplication of the length of the second edge wiring 101, as described above.

A crack detection chip according to an exemplary embodiment of the inventive concept will be described below with reference to FIGS. 8 and 9. Repeat descriptions of will be omitted or simplified.

Figure 8:
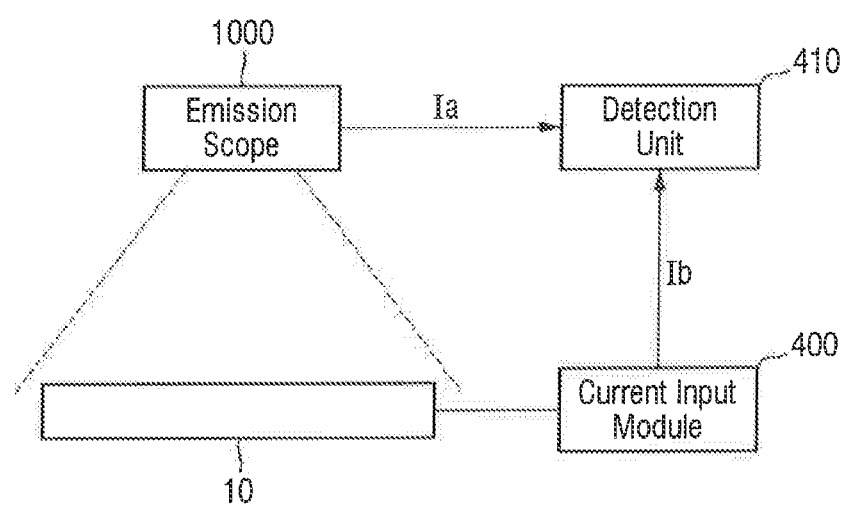
FIG. 8 is a layout diagram for explaining a crack detection chip according to an exemplary embodiment of the inventive concept.
Figure 9:
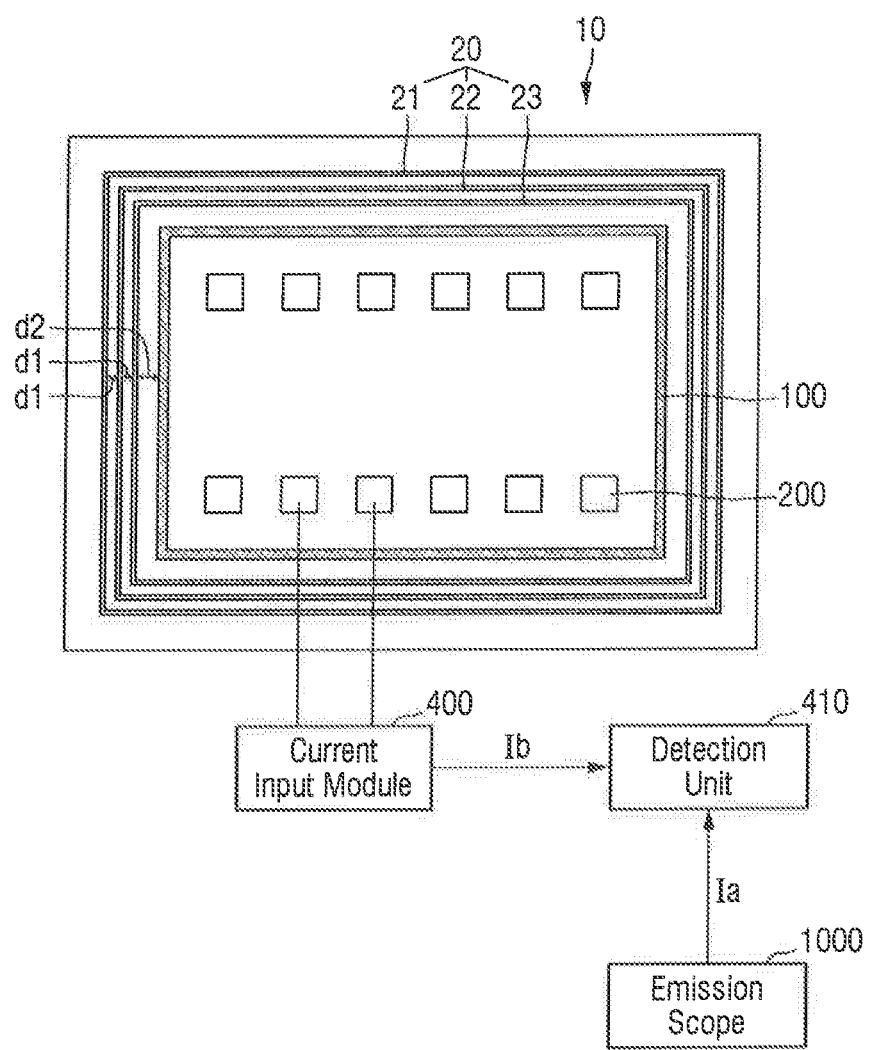
FIG. 9 is a block diagram illustrating a positional relation between the crack detection chip, an emission scope, and a detection unit of FIG. 8 according to an exemplary embodiment of the inventive concept.

FIG. 8 is a layout diagram for explaining a crack detection chip according to an exemplary embodiment of the inventive concept, and FIG. 9 is a block diagram illustrating a positional relation between the crack detection chip, an emission scope, and a detection unit of FIG. 8, according to an exemplary embodiment of the inventive concept.

Referring to FIGS. 8 and 9, in the chip 10 of the crack detection chip according to an exemplary embodiment of the inventive concept, a current input module 400 is connected to the first edge wiring 100 through the pad 200, and the first edge wiring 100 may be inspected by an emission scope 1000.

The current input module 400 may apply a heat generation current to the first edge wiring 100. If a crack exists in the first edge wiring 100, since the resistance is higher in the portion in which the crack exists than in other portions having no crack, heat may be generated by the heat generation current.

The emission scope 1000 is located on the chip 10 and may inspect the chip 10 as a whole. The emission scope 1000 may check a portion to be heated, and may detect a portion of the first edge wiring 100 to be heated by the heat generation current. The emission scope 1000 may acquire information on a heat generation position in the form of an image. In other words, the emission scope 1000 may acquire image information Ia including the heat generation position. The emission scope 1000 may transmit the image information Ia to a detection unit 410.

The detection unit 410 may receive current input information Ib from the current input module 400. The current input information Ib may include information about what magnitude of current is applied to the first edge wiring 100 by the current input module 400, or what magnitude of voltage is applied to the first edge wiring 100. Further, the current input information Ib may include size information of the chip 10 and size information of the first edge wiring 100. However, the inventive concept is not limited thereto.

The detection unit 410 may accurately detect which part of the chip 10 has a crack through the current input information Ib and the image information Ia.

Hereinafter, a crack detection chip according to an exemplary embodiment of the inventive concept will be described referring to FIG. 10. Repeat descriptions will be omitted or simplified.

Figure 10:
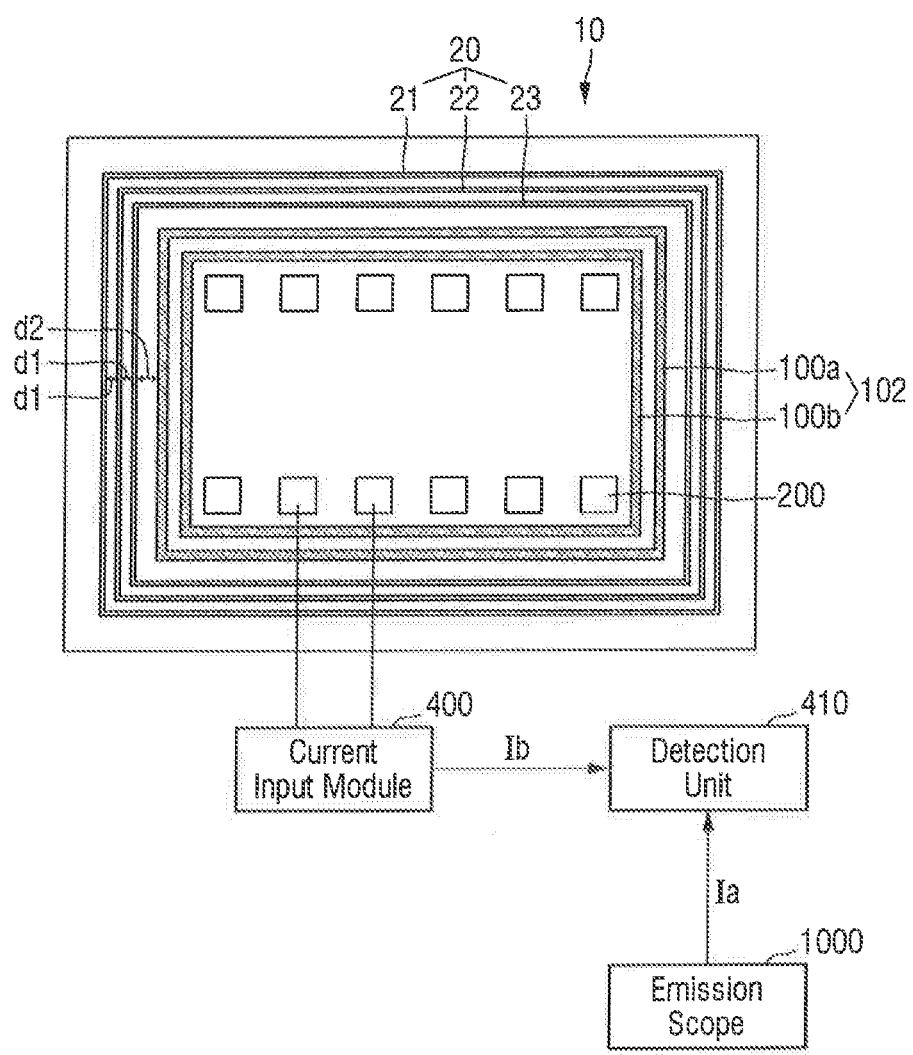
FIG. 10 is a layout diagram for explaining a crack detection chip according to an exemplary embodiment of the inventive concept.

FIG. 10 is a layout diagram for explaining a crack detection chip according to an exemplary embodiment of the inventive concept.

Referring to FIG. 10, the crack detection chip according to an exemplary embodiment of the inventive concept may include a third edge wiring 102.

The third edge wiring 102 may include a first wiring 100a and a second wiring 100b. The first wiring 100a may be arranged between the second wiring 100b and the guard ring 20. The second wiring 100b may be located inside the first wiring 100a.

The first wiring 100a and the second wiring 100b may be disposed to be spaced apart from each other. The first wiring 100a and the second wiring 100b may be connected to the current input module 400 through the pad 200. The first wiring 100a and the second wiring 100b may be connected to the current input module 400 independently from each other through the different pads 200.

The current input module 400 may apply different currents or voltages to the first wiring 100a and the second wiring 100b. For example, the current input module 400 may apply a VDD voltage to the first wiring 100a and may apply a VSS voltage to the second wiring 100b. Accordingly, heat generation currents of different magnitudes may be applied to the first wiring 100a and the second wiring 100b.

If a crack occurs, in a case where a plurality of different levels of voltage are applied as compared with a single voltage, the emission scope 1000 may more clearly check the heat generation position. This is because the degree of generation of heat of photons differs depending on the magnitude of voltage or current.

Therefore, the crack detection chip according to the present exemplary embodiment may more precisely detect the crack position.

Hereinafter, a crack detection chip according to an exemplary embodiment of the inventive concept will be described referring to FIG. 11. Repeat descriptions will be omitted or simplified.

Figure 11:
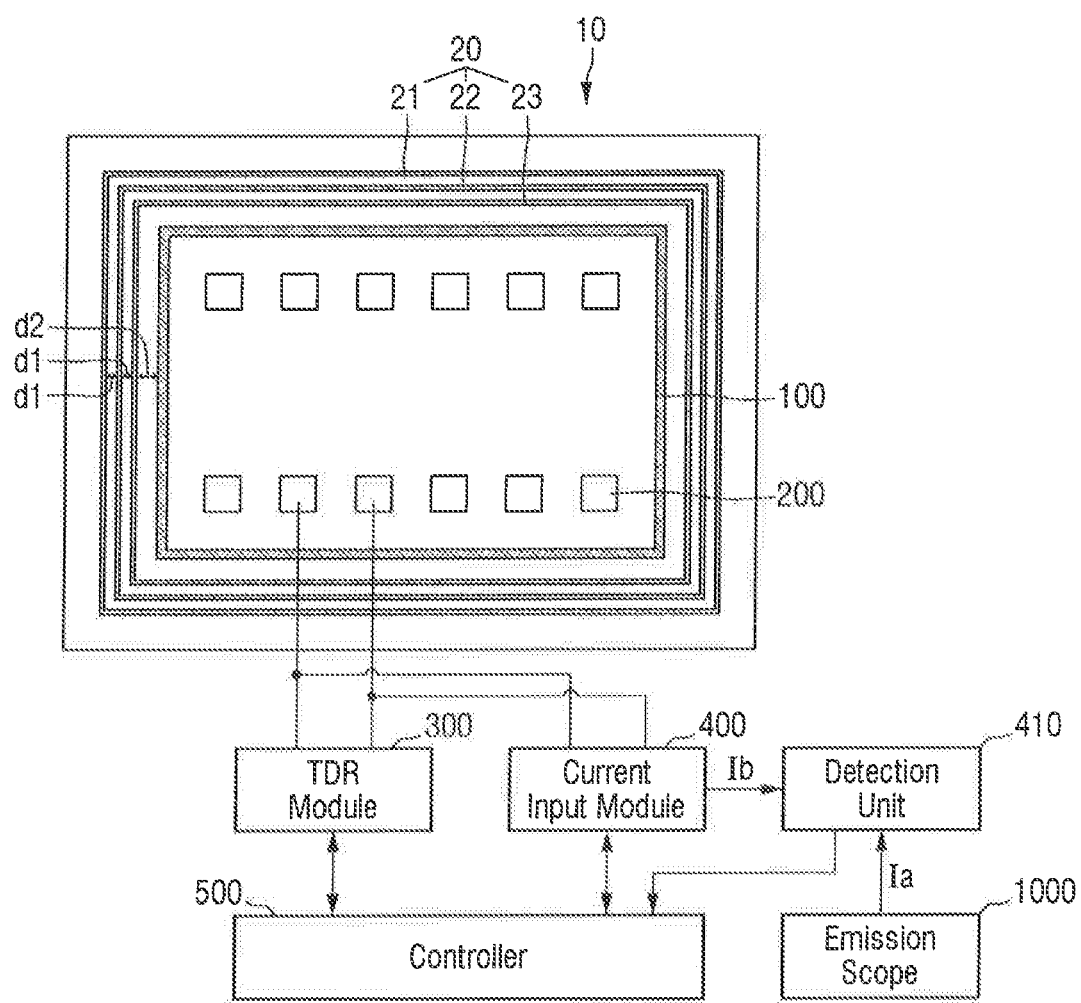
FIG. 11 is a layout diagram for explaining a crack detection chip according to an exemplary embodiment of the inventive concept.

FIG. 11 is a layout diagram for explaining a crack detection chip according to an exemplary embodiment of the inventive concept.

Referring to FIG. 11, the first edge wiring 100 of the crack detection chip according to an exemplary embodiment of the inventive concept may be connected to both the TDR module 300 and the current input module 400.

As described above, the TDR module 300 may detect a crack, using time domain reflectometry. The current input module 400 may detect a crack through the emission scope 1000 and the detection unit 410.

A controller 500 may be connected to both the TDR module 300 and the current input module 400. The controller 500 may decide to simultaneously execute the crack detection methods of the TDR module 300 and the current input module 400 or to sequentially execute the crack detection methods. Alternatively, the controller 500 may perform a control to execute only the crack detection method of either the TDR module 300 or the current input module 400.

For example, when the result of the crack detection method of the TDR module 300 is unclear, the controller 500 may perform the crack detection method using the current input module 400, the emission scope 1000, and the detection unit 410. Conversely, when the result of the crack detection method using the current input module 400, the emission scope 1000, and the detection unit 410 is unclear, the controller 500 may perform the crack detection method of the TDR module 300. The controller 500 may acquire more accurate crack position by combining the two results.

Alternatively, when the reliability of the result of the crack detection method executed first is high, the controller 500 may not perform another crack detection method. As a result, it is possible to minimize the resources executed for crack detection.

Depending on the type of crack, there may be a difference between accuracy of the method of the TDR module 300 and accuracy of the method of the emission scope 1000. Therefore, the crack detection chip according to the present exemplary embodiment may more accurately and efficiently detect cracks by appropriately using the two methods through the controller 500.

Hereinafter, a crack detection chip according to an exemplary embodiment of the inventive concept will be described with reference to FIG. 12. Repeat descriptions will be omitted or simplified.

Figure 12:
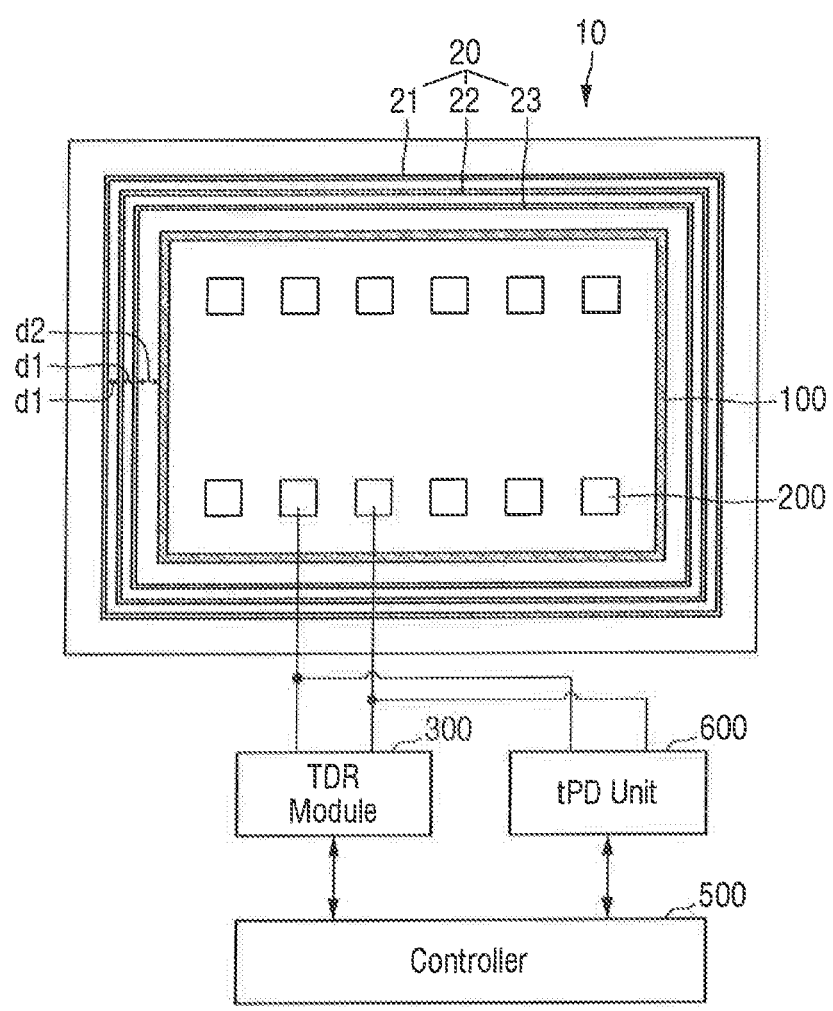
FIG. 12 is a layout diagram for explaining a crack detection chip according to an exemplary embodiment of the inventive concept.

FIG. 12 is a layout diagram for explaining a crack detection chip according to an exemplary embodiment of the inventive concept.

Referring to FIG. 12, the first edge wiring 100 of the crack detection chip according to an exemplary embodiment of the inventive concept may be connected to a time propagation delay (tPD) unit 600.

The tPD unit 600 may be connected to the first edge wiring 100 through the pad 200. The tPD unit 600 may apply an input signal to the first edge wiring 100. The input signal applied to the first edge wiring 100 by the tPD unit 600 travels along the first edge wiring 100 and may return to the tPD unit 600 again. The tPD unit 600 may determine the presence or absence of a crack by measuring an arrival time from the time point when the input signal is applied to the time point when the input signal returns again.

The tPD unit 600 may determine the presence or absence of a crack by comparing a new arrival time with a reference arrival time. The reference arrival time is stored in advance and represents an arrival time when no crack exists. If the new arrival time becomes longer than the reference arrival time, the tPD unit 600 may determine that a crack exists.

The controller 500 may first instruct the tPD unit 600 to determine the presence or absence of a crack. Subsequently, when the tPD unit 600 determines that a crack exists, the controller 500 may instruct the TDR module 300 to detect the correct position of the crack.

The crack detection chip according to the present exemplary embodiment first simply determines the presence or absence of cracks by the tPD unit 600, and operates the TDR module 300 only when it is determined that there is a crack. Accordingly, efficiency of crack detection can be dramatically enhanced.

Hereinafter, a crack detection chip according to an exemplary embodiment of the inventive concept will be described with reference to FIGS. 13 and 14. Repeat descriptions will be omitted or simplified.

Figure 13:
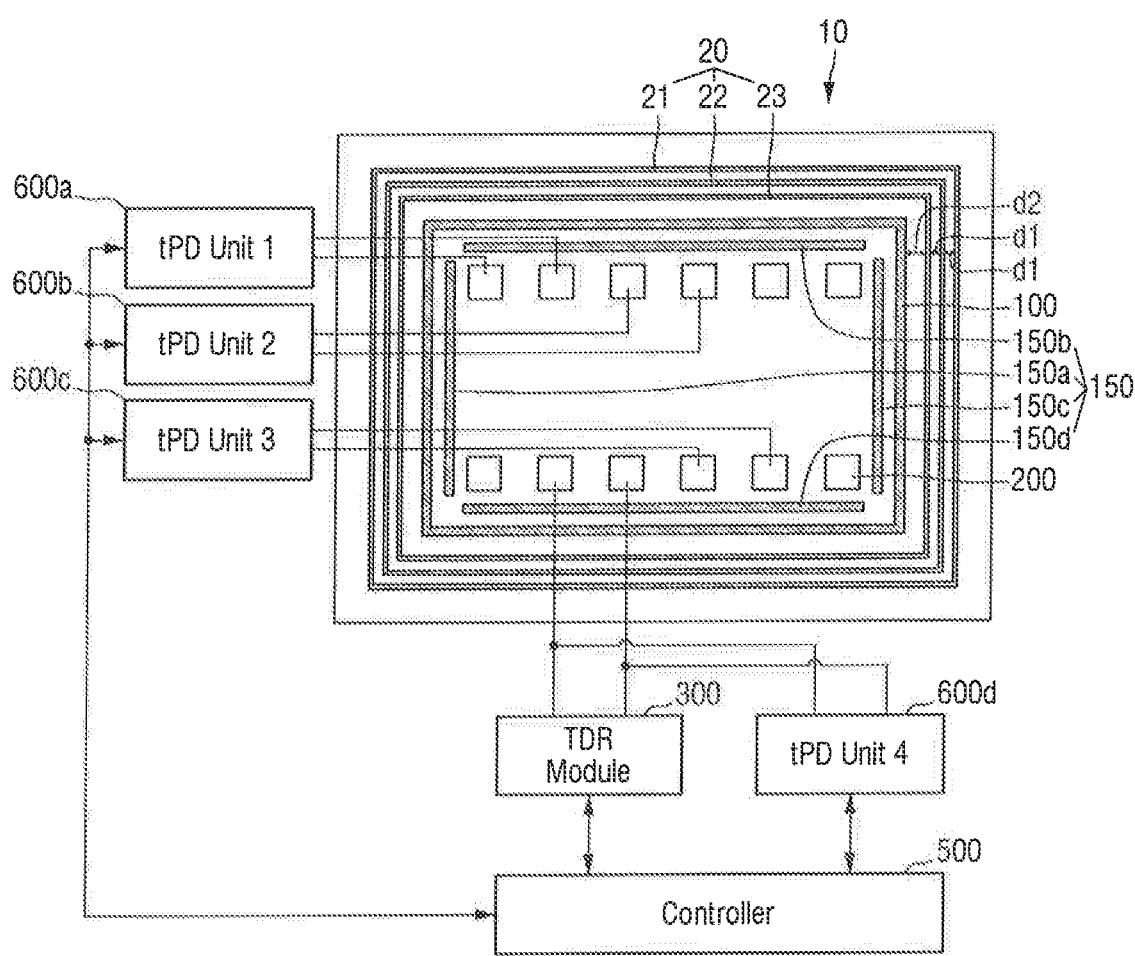
FIG. 13 is a layout diagram for explaining a crack detection chip according to an exemplary embodiment of the inventive concept.
Figure 14:
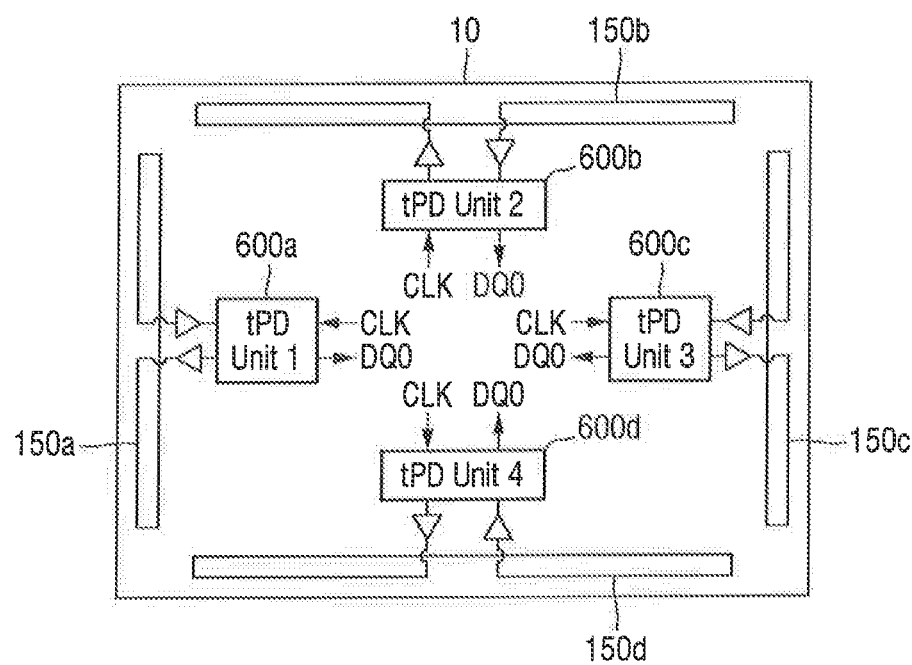
FIG. 14 is a conceptual diagram for explaining the operation of the crack detection chip and a time propagation delay (tPD) unit of FIG. 13 according to an exemplary embodiment of the inventive concept.

FIG. 13 is a layout diagram for explaining the crack detection chip according to an exemplary embodiment of the inventive concept, and FIG. 14 is a conceptual diagram illustrating the operation of the crack detection chip and a time propagation delay (tPD) unit of FIG. 13 according to an exemplary embodiment of the inventive concept.

Referring to FIGS. 13 and 14, the crack detection chip according to an exemplary embodiment of the inventive concept may include a divided edge wiring 150.

The divided edge wiring 150 may be disposed in an inner direction of the first edge wiring 100. However, the inventive concept is not limited thereto. In exemplary embodiments of the inventive concept, the divided edge wiring 150 may also be located in an outer direction of the first edge wiring 100.

Like the first edge wiring 100, the divided edge wiring 150 may be disposed in a closed curve shape along the edge of the chip 10. The divided edge wiring 150 may include a first divided edge wiring 150a, a second divided edge wiring 150b, a third divided edge wiring 150c, and a fourth divided edge wiring 150d. However, the configuration in which the divided edge wiring 150 is divided into four portions is only one example, and the divided edge wiring 150 may be variously divided.

The first divided edge wiring 150a, the second divided edge wiring 150b, the third divided edge wiring 150c, and the fourth divided edge wiring 150d may be electrically insulated from one another. Further, the first divided edge wiring 150a, the second divided edge wiring 150b, the third divided edge wiring 150c, and the fourth divided edge wiring 150d may be electrically connected to different pads 200.

The tPD unit 600 may include a first tPD unit 600a, a second tPD unit 600b, a third tPD unit 600c, and a fourth tPD unit 600d. For example, the first tPD unit 600a may be electrically connected to the first divided edge wiring 150a through the pad 200, and the second tPD unit 600b may be electrically connected to the second divided edge wiring 150b through the pad 200. The third tPD unit 600c may be electrically connected to the third divided edge wiring 150c through the pad 200, and the fourth tPD unit 600d may be electrically connected to the fourth divided edge wiring 150d through the pad 200.

The first tPD unit 600a, the second tPD unit 600b, the third tPD unit 600c, and the fourth tPD unit 600d may apply clock (CLK) signals and receive an output DQ0. Thus, in the crack detection chip according to the present exemplary embodiment, the tPD unit 600 and the divided edge wiring 150 may determine the presence or absence of cracks by dividing the region. Thus, it is possible to more accurately grasp which region a crack is located.

The controller 500 determines which region has a crack through the first tPD unit 600a, the second tPD unit 600b, the third tPD unit 600c, and the fourth tPD unit 600d, and may accurately determine the position of the crack through the TDR module 300 and the first edge wiring 100 on the basis of the result thereof.

Accordingly, the crack detection chip according to the present exemplary embodiment simply determines the presence or absence of cracks by the four tPD units 600, and only when it is determined that there is a crack, the TDR module 300 is operated. Accordingly, the efficiency of crack detection can be dramatically enhanced. In addition, since it is possible to first determine the approximate crack position by the four tPD units 600, it is possible to more accurately determine the position of the crack.

Hereinafter, a crack detection chip according to an exemplary embodiment of the inventive concept will be described with reference to FIG. 15. Repeat descriptions will be omitted or simplified.

Figure 15:
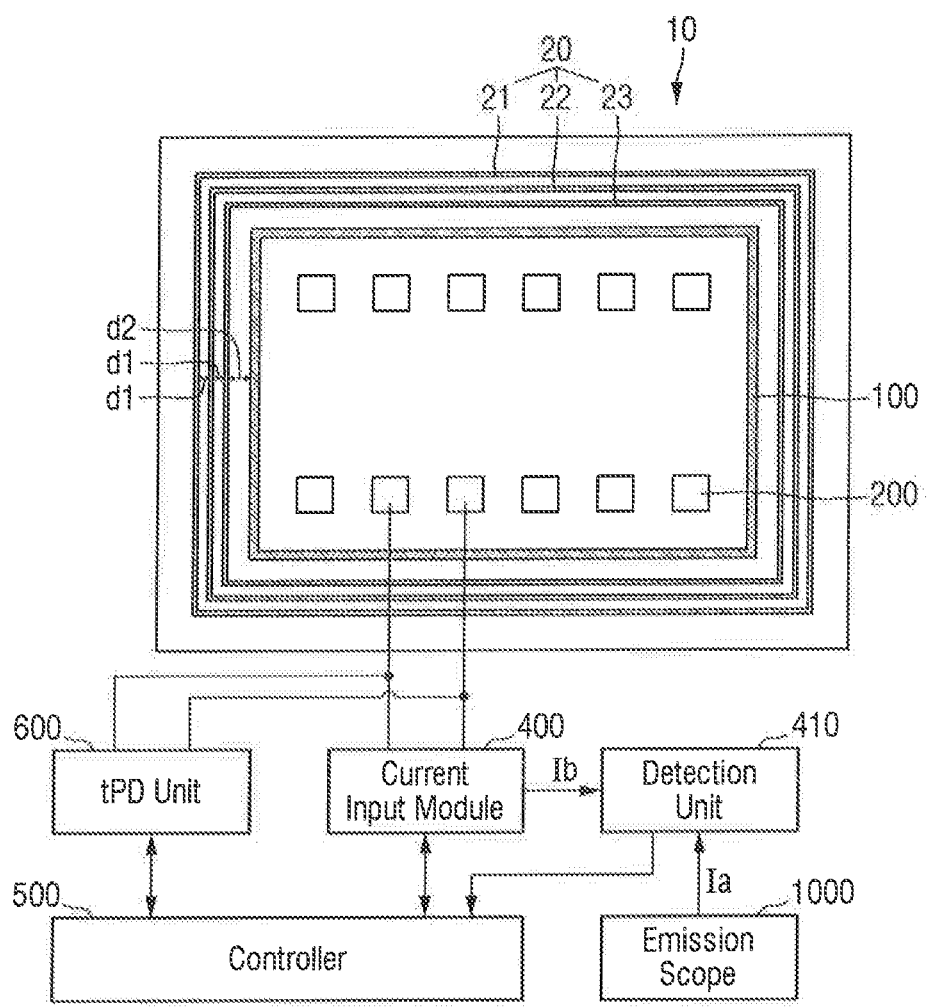
FIG. 15 is a layout diagram for explaining a crack detection chip according to an exemplary embodiment of the inventive concept.

FIG. 15 is a layout diagram for explaining the crack detection chip according to an exemplary embodiment of the inventive concept.

Referring to FIG. 15, the first edge wiring 100 of the crack detection chip according to an exemplary embodiment of the inventive concept may be connected to both the current input module 400 and the tPD unit 600.

As described above, the current input module 400 may detect cracks through the emission scope 1000 and the detection unit 410, and the tPD unit 600 may determine the presence or absence of cracks through the input signal.

The controller 500 may first instruct the tPD unit 600 to determine the presence or absence of a crack. Subsequently, when the tPD unit 600 determines that the crack exists, the controller 500 instructs the current input module 400, the emission scope 1000, and the detection unit 410 to detect the correct position of the crack.

The crack detection chip according to the present exemplary embodiment first simply determines the presence or absence of cracks by the tPD unit 600, and only when it is determined that there is a crack, the crack detection chip operates the current input module 400, the emission scope 1000, and the detection unit 410. Accordingly, the efficiency of crack detection can be dramatically enhanced.

Hereinafter, a crack detection chip according to an exemplary embodiment of the inventive concept will be described with reference to FIG. 16. Repeat descriptions will be omitted or simplified.

Figure 16:
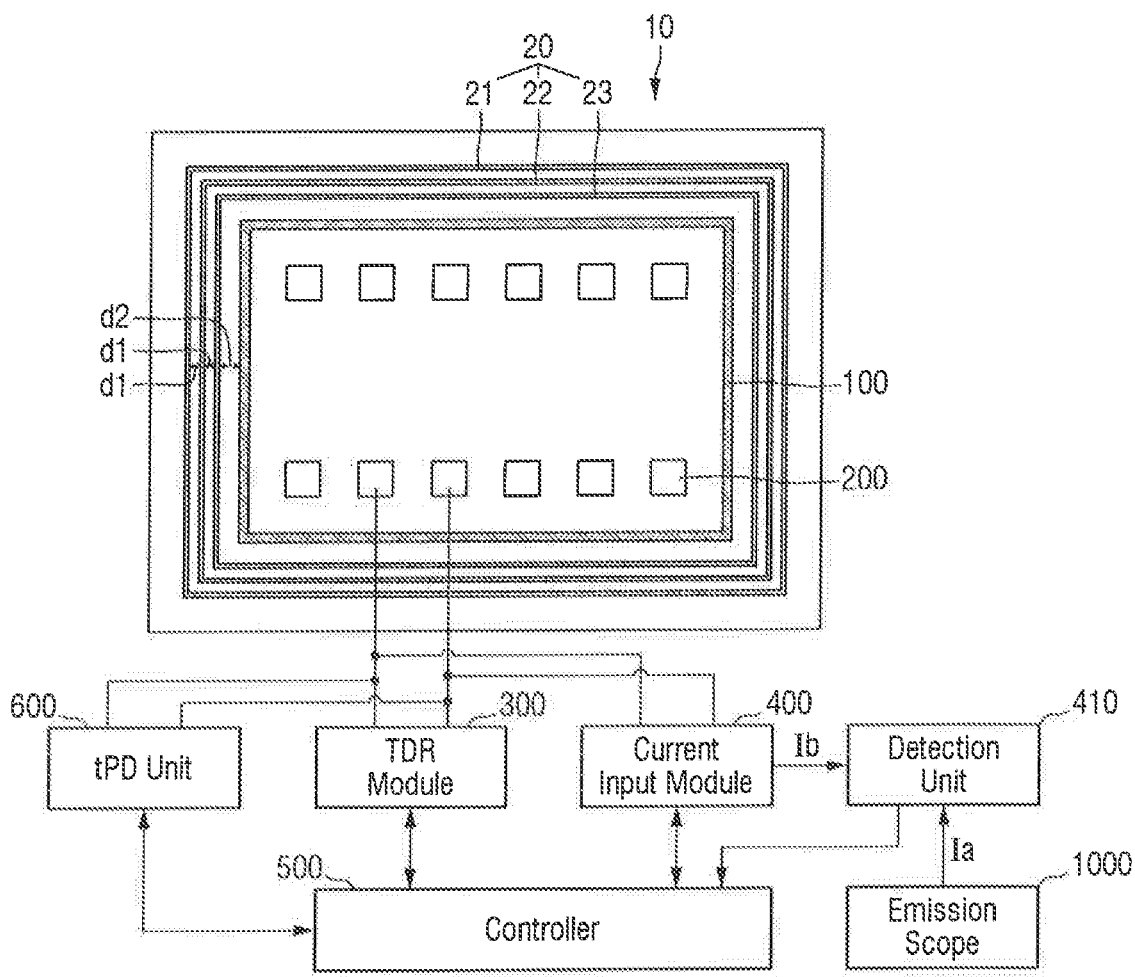
FIG. 16 is a layout diagram for explaining a crack detection chip according to an exemplary embodiment of the inventive concept.

FIG. 16 is a layout diagram for explaining the crack detection chip according to an exemplary embodiment of the inventive concept.

Referring to FIG. 16, the first edge wiring 100 of the crack detection chip according to an exemplary embodiment of the inventive concept may be connected to the TDR module 300, the current input module 400, and the tPD unit 600.

As described above, the TDR module 300 may detect a crack using time domain reflectometry. The current input module 400 may detect a crack through the emission scope 1000 and the detection unit 410. The tPD unit 600 may determine the presence or absence of a crack through the input signal.

The controller 500 may first instruct the tPD unit 600 to determine the presence or absence of a crack. Subsequently, if the tPD unit 600 determines that a crack exists, the controller 500 may instruct the TDR module 300 or the current input module 400, the emission scope 1000, and the detection unit 410 to detect a correct position of the crack.

The controller 500 may decide to execute simultaneously or sequentially the crack detection methods of the TDR module 300 and the current input module 400. Alternatively, the controller 500 may perform the control to execute only one crack detection method of the TDR module 300 or the current input module 400.

Through this, the crack detection chip according to the present exemplary embodiment may more accurately, efficiently, and accurately detect cracks, by appropriately using the two methods through the controller 500.

Hereinafter, a crack detection chip according to an exemplary embodiment of the inventive concept will be described with reference to FIG. 17. Repeat descriptions will be omitted or simplified.

Figure 17:
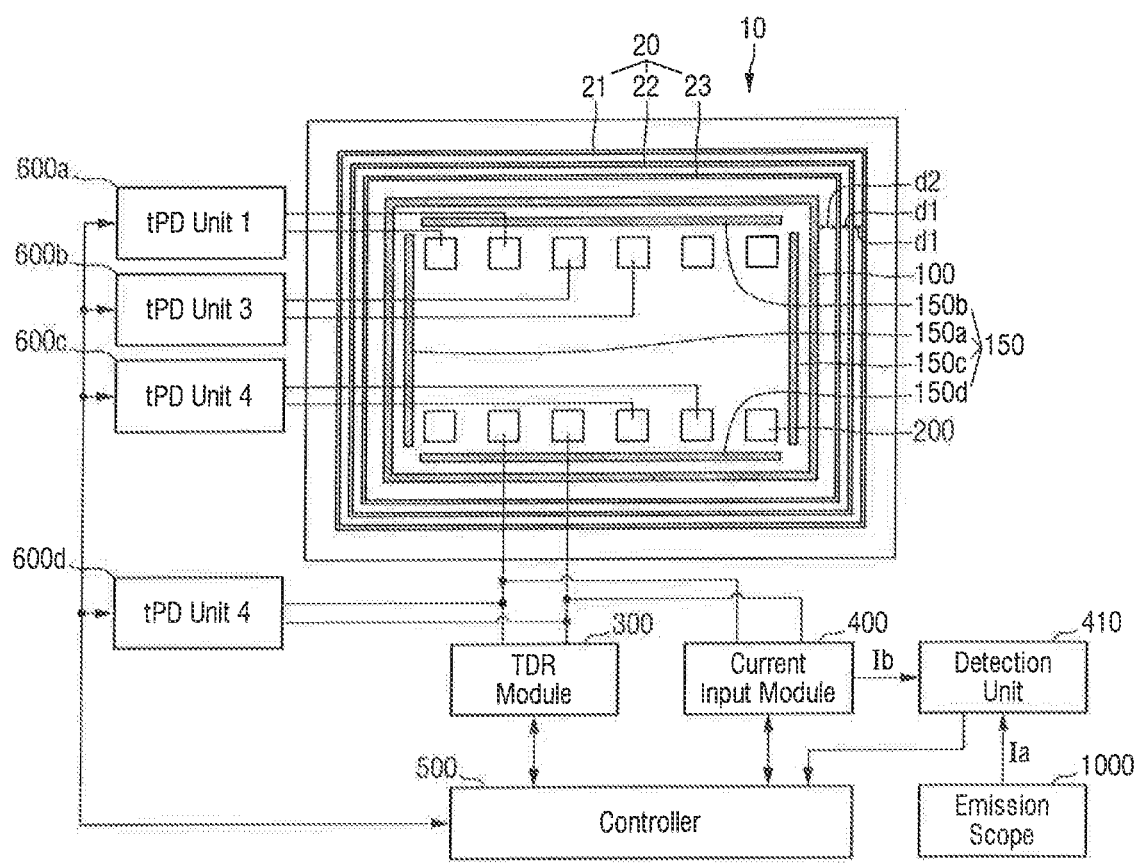
FIG. 17 is a layout diagram for explaining a crack detection chip according to an exemplary embodiment of the inventive concept.

FIG. 17 is a layout diagram for explaining the crack detection chip according to an exemplary embodiment of the inventive concept.

Referring to FIG. 17, the crack detection chip according to an exemplary embodiment of the inventive concept includes the divided edge wiring 150, and the first edge wiring 100 may be connected to the TDR module 300, the current input module 400, and the four tPD units 600.

The four tPD units 600, e.g., the first tPD unit 600a, the second tPD unit 600b, the third tPD unit 600c, and the fourth tPD unit 600d, may correspond to the first divided edge wiring 150a, the second divided edge wiring 150b, the third divided edge wiring 150c, and the fourth divided edge wiring 150d, respectively.

The controller 500 determines in which region a crack exists through the first tPD unit 600a, the second tPD unit 600b, the third tPD unit 600c, and the fourth tPD unit 600d, and may accurately determine the position of the crack on the basis of the result, through the TDR module 300, or the current input module 400, the emission scope 1000, and the detection unit 410.

Thus, the crack detection chip according to the present exemplary embodiment may first simply determine the presence or absence of crack by the four tPD units 600, and only when it is determined that there is a crack, the crack detection chip operates the TDR module 300 or the current input module 400, the detection unit 410, and the emission scope 1000. Accordingly, the efficiency of crack detection can be dramatically enhanced. Additionally, since the approximate crack position may be determined first by the plurality of tPD units 600, the position of the crack may be more accurately determined.

Hereinafter, a crack detection method according to an exemplary embodiment of the inventive concept will be described with reference to FIGS. 3 to 5 and 18. Repeat descriptions will be omitted or simplified.

Figure 18:
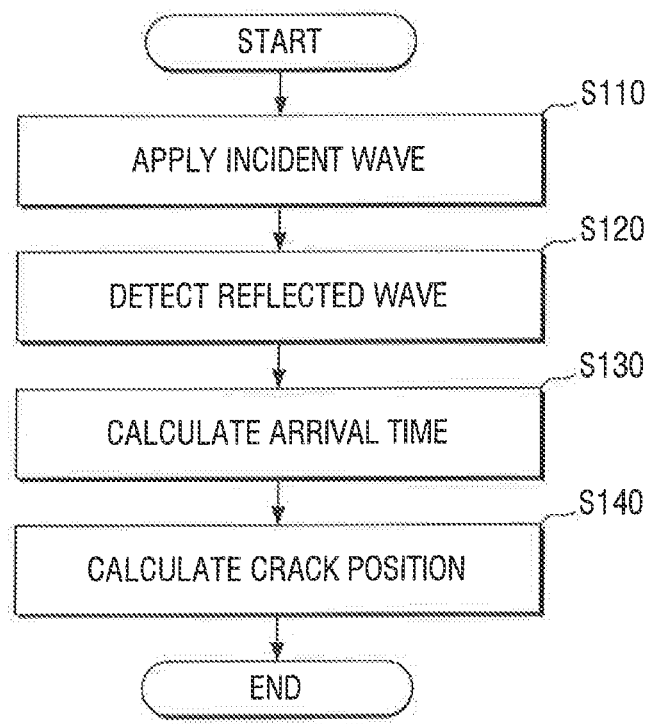
FIG. 18 is a flowchart for explaining a crack detection method according to an exemplary embodiment of the inventive concept.

FIG. 18 is a flowchart for explaining the crack detection method according to an exemplary embodiment of the inventive concept.

Referring to FIG. 18, an incident wave is applied (S110).

For example, referring to FIGS. 3 to 5, the TDR module 300 may apply an incident wave to the first edge wiring 100 through the pad 200. The incident wave may form a reflected wave when encountering a crack CR while traveling through the first edge wiring 100.

Referring again to FIG. 18, a reflected wave is detected (S120).

For example, referring to FIGS. 3 to 5, the TDR module 300 may detect the reflected wave traveling in a direction opposite to the incident wave.

Referring again to FIG. 18, the arrival time is calculated (S130).

For example, referring to FIGS. 3 to 5, the TDR module 300 calculates the first reflected wave distance L by calculating the application time point of the incident wave and the arrival time point of the reflected wave. The first reflected wave distance L may refer to a distance from the position at which the crack CR is formed to the TDR module 300 at which the reflected wave arrives. The TDR module 300 detects the first reflected wave distance L and may accurately check the position at which the crack CR occurs accordingly.

Referring again to FIG. 18, the crack position is calculated (S140).

For example, referring to FIGS. 3 to 5, the first reflected wave distance L may be calculated through the velocity of the incident wave, the velocity of the reflected wave, the arrival time, and the like.

Hereinafter, a crack detection method according to an exemplary embodiment of the inventive concept will be described with reference to FIGS. 9 to 11, 19, and 20. Repeat descriptions will be omitted or simplified.

Figure 19:
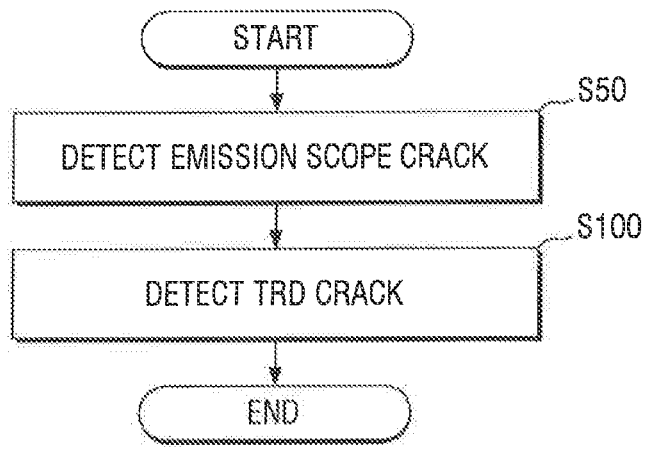
FIG. 19 is a flowchart for explaining a crack detection method according to an exemplary embodiment of the inventive concept.
Figure 20:
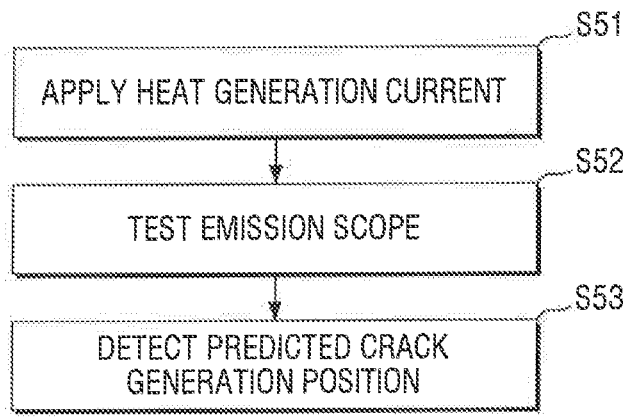
FIG. 20 is a flowchart for explaining an emission scope crack detection operation of FIG. 19 in detail according to an exemplary embodiment of the inventive concept.

FIG. 19 is a flowchart for explaining the crack detection method according to an exemplary embodiment of the inventive concept, and FIG. 20 is a flowchart for explaining an emission scope crack detecting operation of FIG. 19 in detail according to an exemplary embodiment of the inventive concept.

Referring to FIGS. 19 and 20, the crack detection is executed through the emission scope 1000 (S50), and a heat generation current is applied (S51).

For example, referring to FIGS. 9 to 11, the current input module 400 may apply the heat generation current to the first edge wiring 100. If a crack is present in the first edge wiring 100, since the resistance is higher in the portion having the crack than in other portions without a crack, heat may be generated by the heat generation current.

Referring again to FIG. 20, inspection is performed with the emission scope 1000 (S52).

For example, referring to FIGS. 9 to 11, the emission scope 1000 is located on the chip 10 and may inspect the chip 10 as a whole. The emission scope 1000 may check a portion to be heated, and may detect a portion of the first edge wiring 100 that generates heat by the heat generation current.

Referring again to FIG. 20, a predicted crack generation position is detected (S53).

For example, referring to FIGS. 9 to 11, the emission scope 1000 may acquire information on the heat generation position in the form of an image. In other words, the emission scope 1000 may acquire the image information Ia including the heat generation position. The emission scope 1000 may transmit the image information Ia to the detection unit 410.

The detection unit 410 may receive the current input information Ib from the current input module 400. The detection unit 410 may detect the predicted crack generation position on a crack occurrence portion of the chip 10 through the current input information Ib and the image information Ia.

Referring again to FIG. 19, the TDR crack detection is performed (S100).

The TDR crack detection refers to the method described in FIG. 18. Since the crack detection method using the emission scope 1000 (S50) is different from the TDR crack detection method, different results may be obtained. Therefore, the predicted crack generation position is detected by first executing the crack detection method using the emission scope 1000 (S50), and a very accurate crack position may be detected by executing the TDR crack detection (S100) on the basis of this detection. However, the inventive concept is not limited thereto.

Alternatively, the crack detection method according to the present exemplary embodiment executes the TDR crack detection (S100) to detect the predicted crack generation position, and may detect the accurate crack position by executing the crack detection method using the emission scope 1000 (S50) on the basis of the predicted crack generation position.

Hereinafter, a crack detection method according to an exemplary embodiment of the inventive concept will be described with reference to FIGS. 12, 18, 21, and 22. Repeat descriptions will be omitted or simplified.

Figure 21:
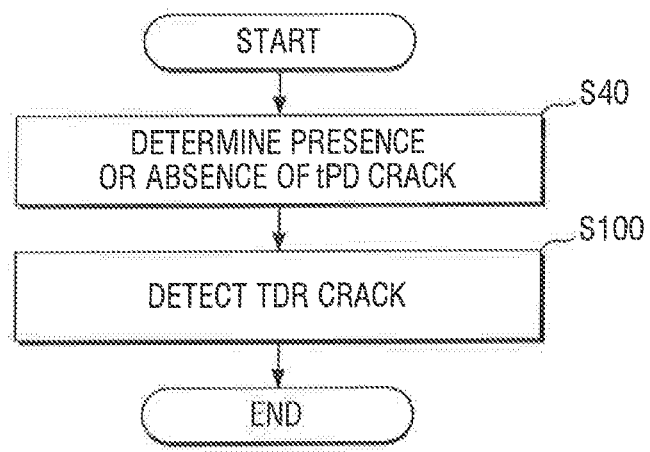
FIG. 21 is a flowchart for explaining a crack detection method according to an exemplary embodiment of the inventive concept.
Figure 22:
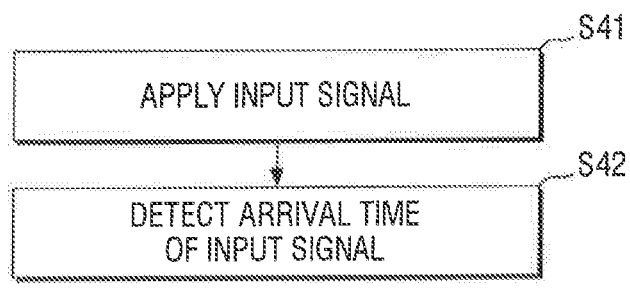
FIG. 22 is a flowchart for explaining an operation of determining the presence or absence of a tPD crack of FIG. 21 in detail according to an exemplary embodiment of the inventive concept.

FIG. 21 is a flowchart for explaining the crack detection method according to an exemplary embodiment of the inventive concept, and FIG. 22 is a flowchart for explaining an operation of determining the presence or absence of a tPD crack of FIG. 21 in detail according to an exemplary embodiment of the inventive concept.

Referring to FIG. 21, the presence or absence of the tPD crack is determined (S40). Referring to FIG. 22, an input signal is applied (S41).

For example, referring to FIG. 12, the tPD unit 600 may apply the input signal to the first edge wiring 100. The input signal applied to the first edge wiring 100 by the tPD unit 600 travels along the first edge wiring 100 and may return to the tPD unit 600 again.

Referring again to FIG. 22, the arrival time of the input signal is detected (S42).

For example, referring to FIG. 12, the tPD unit 600 may determine the presence or absence of the crack by measuring the arrival time from the time point at which the input signal is applied to the time point at which the input signal returns again. The tPD unit 600 may determine the presence or absence of a crack by comparing the new arrival time with the reference arrival time that is stored in advance in the case where no crack exists. If the new arrival time is longer than the reference arrival time, the tPD unit 600 may determine that a crack exists.

Referring again to FIG. 21, the TDR crack detection is performed (S100).

The TDR crack detection refers to the method described in FIG. 18. The crack detection method according to the present exemplary embodiment first executes the tPD crack presence or absence determination (S40), and may execute the TDR crack detection (S100) only when it is determined that there is a crack. Accordingly, it is possible to enhance the efficiency.

Hereinafter, a crack detection method according to an exemplary embodiment of the inventive concept will be described with reference to FIGS. 13, 18, 21, and 23. Repeat descriptions will be omitted or simplified.

Figure 23:
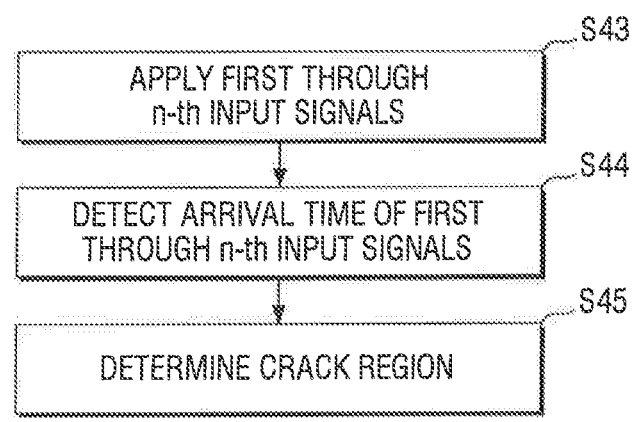
FIG. 23 is a flowchart for explaining a crack detection method according to an exemplary embodiment of the inventive concept.

FIG. 23 is a flowchart for explaining the crack detection method according to an exemplary embodiment of the inventive concept.

Referring to FIG. 21, the tPD crack presence or absence determination is performed (S40).

For example, referring to FIG. 23, first to n-th input signals are applied (S43).

For convenience of explanation, n is set to 4. Referring to FIG. 13, the first tPD unit 600a, the second tPD unit 600b, the third tPD unit 600c, and the fourth tPD unit 600d may apply the clock (CLK) signals to each of the first divided edge wiring 150a, the second divided edge wiring 150b, the third divided edge wiring 150c, and the fourth divided edge wiring 150d.

Referring again to FIG. 23, arrival times of the first to n-th input signals are detected (S44).

Referring to FIG. 13, the first tPD unit 600a, the second tPD unit 600b, the third tPD unit 600c, and the fourth tPD unit 600d may detect the respective arrival times.

Referring again to FIG. 23, a crack region is determined (S45).

Referring to FIG. 13, each tPD unit 600 may determine whether or not a crack exists by comparing a new arrival time with the reference arrival time. If the new arrival time is longer than the reference arrival time, it may be determined that a crack exists.

Referring again to FIG. 21, the TDR crack detection is performed (S100).

The above TDR crack detection refers to the method described in FIG. 18. The crack detection method according to the present exemplary embodiment first executes the tPD crack presence or absence determination (S40) and may execute the TDR crack detection (S100) only when it is determined that there is a crack. Accordingly, it is possible to enhance the efficiency. Further, as it is possible to know which region of the divided regions the crack is located through the tPD crack presence or absence determination (S40), it is possible to have higher efficiency.

Hereinafter, a crack detection method according to an exemplary embodiment of the inventive concept will be described with reference to FIGS. 18, 20, and 22 to 24. Repeat descriptions will be omitted or simplified.

Figure 24:
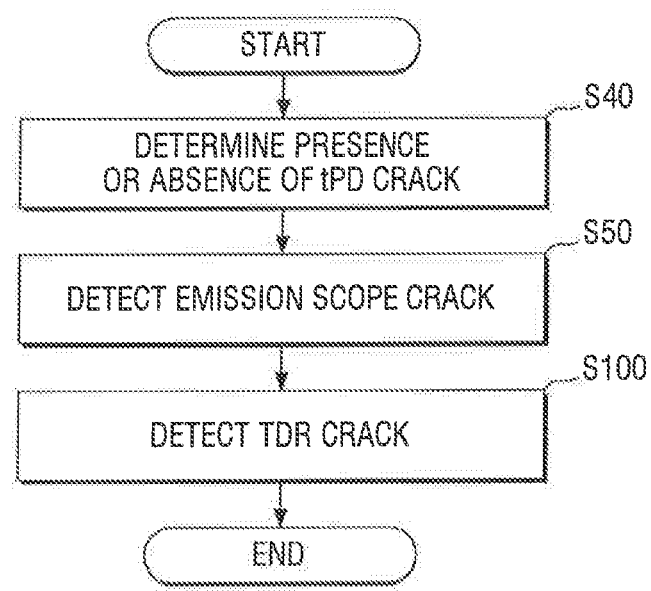
FIG. 24 is a flowchart for explaining a crack detection method according to an exemplary embodiment of the inventive concept.

FIG. 24 is a flowchart for explaining the crack detection method according to an exemplary embodiment of the inventive concept.

Referring to FIG. 24, the tPD crack presence or absence determination is performed (S40).

The TDR crack presence or absence determination refers to the method described in FIG. 22 or 23.

Subsequently, the emission scope crack detection is performed (S50).

The emission scope crack detection refers to the method described in FIG. 20.

Subsequently, the TDR crack detection is performed (S100).

The TDR crack detection refers to the method described in FIG. 18.

In the crack detection method according to an exemplary embodiment of the inventive concept, the operations S50 and S100 may be executed in a different order.

While the inventive concept has been particularly shown and described with reference to exemplary embodiments thereof, it will be understood by those of ordinary skill in the art that various changes in form and details may be made thereto without departing from the spirit and scope of the inventive concept as set forth by the following claims.

What is claimed is:

1. A crack detection chip comprising:
a chip which includes an internal region and an external region surrounding the internal region;
a guard ring formed inside the chip, extending from an upper surface of the chip, and along an edge of the chip to define the internal region and the external region;
an edge wiring disposed along an edge of the internal region in the form of a closed curve; and
a pad which is exposed on a surface of the chip and is connected to the edge wiring,
wherein the edge wiring is connected to a Time Domain Reflectometry (TDR) module configured to apply an incident wave to the edge wiring through the pad, and detect a reflected wave formed in the edge wiring to detect a position of a crack.

2. The crack detection chip of claim 1, wherein the guard ring comprises first and second guard rings, and
a distance between the first guard ring and the internal region is larger than a distance between the second guard ring and the internal region.

3. The crack detection chip of claim 1, wherein a direction of the upper surface of the chip is a first direction, and
a width of the guard ring in the first direction is larger than a width of the edge wiring in the first direction.

4. The crack detection chip of claim 1, wherein the edge wiring is connected to a current input module configured to apply a heat generation current to the edge wiring, and
the edge wiring is inspected by an emission scope configured to sense heat generated by the heat generation current.

5. The crack detection chip of claim 4, wherein the edge wiring comprises a first edge wiring and a second edge wiring which are separated from each other,
the pad comprises first and second pads separated from each other and connected to the first and second edge wirings, respectively, and
the current input module applies heat generation currents of different magnitudes to the first and second edge wirings through the first and second pads, respectively.

6. The crack detection chip of claim 1, wherein the edge wiring is connected to a time propagation delay (tPD) unit configured to apply an input signal to the edge wiring through the pad, and determine a presence or absence of a crack through a time at which the input signal propagates through the edge wiring.

7. The crack detection chip of claim 6, further comprising:
a divided edge wiring disposed along an edge of the internal region in the form of a closed curve and separated from the edge wiring,
wherein the divided edge wiring comprises first to n-th divided edge wirings divided from one another,
the pad comprises first to n-th pads connected to the first to n-th divided edge wirings, respectively, and
the tPD unit comprises first through n-th input units configured to input first through n-th input signals to the first through n-th divided edge wirings, respectively, through the first through n-th pads, respectively, to determine presence or absence of a crack.

8. The crack detection chip of claim 1, wherein the TDR module detects the position of the crack through a time at which the reflected wave formed in the edge wiring is detected, and
the reflected wave moves at least once along an entirety of the edge wiring and is detected by the TDR module.

9. The crack detection chip of claim 1, wherein the edge wiring comprises a first portion located at a first distance from the guard ring,
a second portion located at a second distance from the guard ring, and
the second distance is greater than the first distance.

10. The crack detection chip of claim 9, wherein the first and second portions are alternately arranged on the closed curve of the edge wiring.

* * * * *